(12) United States Patent
Nishikawa et al.

(10) Patent No.: US 8,519,411 B2
(45) Date of Patent: Aug. 27, 2013

(54) SEMICONDUCTOR LIGHT EMITTING DEVICE

(75) Inventors: Yukie Nishikawa, Fukuoka-ken (JP);
Shinji Nunotani, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/171,638

(22) Filed: Jul. 11, 2008

(65) Prior Publication Data
US 2009/0014734 A1 Jan. 15, 2009

(30) Foreign Application Priority Data

Jul. 12, 2007 (JP) ................................. 2007-183217

(51) Int. Cl.
*H01L 27/15* (2006.01)
(52) U.S. Cl.
USPC .................. 257/79; 257/95; 257/96; 257/98; 257/E31.118; 257/E31.129
(58) Field of Classification Search
USPC ................................ 257/79, 95–100; 438/27
See application file for complete search history.

(56) References Cited

U.S. PATENT DOCUMENTS

| | | | | |
|---|---|---|---|---|
| 5,048,035 A * | 9/1991 | Sugawara et al. | .......... | 372/45.01 |
| 5,153,889 A * | 10/1992 | Sugawara et al. | .......... | 372/45.01 |
| 5,321,712 A * | 6/1994 | Itaya et al. | .................. | 372/43.01 |
| 5,565,694 A * | 10/1996 | Huang et al. | ..................... | 257/97 |
| 5,600,158 A * | 2/1997 | Noto et al. | ........................ | 257/94 |
| 5,739,553 A * | 4/1998 | Noto et al. | ........................ | 257/94 |
| 5,744,828 A * | 4/1998 | Nozaki et al. | .................... | 257/94 |
| 6,396,862 B1 * | 5/2002 | Wang et al. | ................ | 372/46.01 |
| 6,433,364 B2 * | 8/2002 | Hosoba et al. | .................. | 257/80 |
| 6,468,818 B2 * | 10/2002 | Nakamura et al. | ............... | 438/22 |
| 6,528,823 B2 * | 3/2003 | Akaike et al. | ..................... | 257/79 |
| 6,608,328 B2 * | 8/2003 | Kuo et al. | ........................ | 257/79 |
| 6,791,117 B2 | 9/2004 | Yoshitake et al. | | |
| 7,244,957 B2 | 7/2007 | Nakajo et al. | | |
| 7,511,314 B2 * | 3/2009 | Yamada et al. | ................ | 257/101 |
| 7,528,417 B2 * | 5/2009 | Takeuchi et al. | ................ | 257/96 |

(Continued)

FOREIGN PATENT DOCUMENTS

| | | |
|---|---|---|
| JP | 05-167101 | 7/1993 |
| JP | 08-102548 | 4/1996 |

(Continued)

OTHER PUBLICATIONS

Watanabe, et al, Interface properties for GaAs/InGaAlP heterojunctions by the capacitance-voltage profiling technique, Appl. Phys.Lett. 50(14), Apr. 6, 1987, pp. 906-908.

(Continued)

*Primary Examiner* — A. Sefer
(74) *Attorney, Agent, or Firm* — White & Case LLP

(57) ABSTRACT

A semiconductor light emitting device includes an active layer, an electrode formed above the active layer, a current spreading layer formed between the active layer and the electrode, having n-type conductivity, having a larger bandgap energy than the active layer, and spreading electrons injected from the electrode in the plane of the active layer, and a surface processed layer formed on the current spreading layer, having a larger bandgap energy than the active layer, and having an uneven surface region with a large number of concave-convex structures. The electrode is not formed on the uneven surface region. The conduction band edge energy from the Fermi level of the surface processed layer is higher than that of the current spreading layer.

7 Claims, 9 Drawing Sheets

(56) References Cited

U.S. PATENT DOCUMENTS

| | | | |
|---|---|---|---|
| 2003/0132445 A1* | 7/2003 | Yoshitake et al. | 257/84 |
| 2004/0021142 A1* | 2/2004 | Kuo | 257/79 |
| 2006/0071232 A1* | 4/2006 | Sasakura et al. | 257/103 |
| 2006/0071252 A1* | 4/2006 | Kondo | 257/291 |
| 2006/0202216 A1 | 9/2006 | Itonaga | |
| 2006/0275937 A1* | 12/2006 | Aoyagi et al. | 438/22 |
| 2007/0287223 A1 | 12/2007 | Chen | |
| 2009/0121250 A1* | 5/2009 | DenBaars et al. | 257/98 |
| 2010/0213493 A1* | 8/2010 | Hsu et al. | 257/98 |

FOREIGN PATENT DOCUMENTS

| | | | |
|---|---|---|---|
| JP | 2000-101133 | * | 4/2000 |
| JP | 2004-119839 | * | 4/2004 |
| JP | 2006-108635 | | 4/2006 |
| JP | 2006-253172 | | 9/2006 |
| JP | 2007-42664 | * | 2/2007 |
| JP | 2007-66940 | * | 3/2007 |
| WO | 2007069774 A1 | | 6/2007 |

OTHER PUBLICATIONS

Batey, et al, Energy band alignment in GaAs:(Al,Ga)As heterostructures: the dependence on alloy composition, Appl. Phys. 59(1), Jan. 1, 1986, pp. 200-209.

Japanese Office Action for Application No. 2007-183217 issued on Aug. 5, 2011.

Taiwanese Office Action for Application No. 097126478 issued on Dec. 13, 2011.

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2007-183217, filed on Jul. 12, 2007; the entire contents of which are incorporated herein by reference.

BACKGROUND OF THE INVENTION

1. Field of the Invention

This invention relates to a semiconductor light emitting device.

2. Background Art

The semiconductor light emitting device is expanding its applications as a source for infrared red~yellow~green~to blue light and white light, and is required to have high light extraction efficiency and high reliability.

For example, high light extraction efficiency is realized by roughening the light extraction surface of the light emitting device with a large number of concave-convex structures. As total internal reflection of light emitted from inside the light emitting device at the interface between the device surface and the device outside is reduced by the surface roughening, the light extraction efficiency to the device outside can be improved.

JP-A 2006-108635 (Kokai) discloses a semiconductor light emitting device with nanometer-sized concave-convex structures at its surface. This nanometer-sized concave-convex structure includes a nanometer-sized convex structure having a mesa part with graded refractive index, a cylinder with diffraction effect, and a corn with graded refractive index, thereby improving the light extraction efficiency.

However, the formation process of the concave-convex structures at the surface likely induces processing damage. In the case where current spreads laterally in the light emitting device to get light emission from a wide device area, the current may also spread into the damaged region, resulting in deterioration of the brightness.

Band discontinuity between InGaAlP and GaAs is disclosed in M. O. Watanabe et al., Appl. Phys. Lett. 50 (1987) 906 (hereinafter referred to as Non-Patent Document 1). Band discontinuity between GaAlAs and GaAs is described in J. Batey et al., J. Appl. Phys. 59 (1986) 200 (hereinafter referred to as Non-Patent Document 2).

SUMMARY OF THE INVENTION

According to an aspect of the invention, there is provided a semiconductor light emitting device including: an active layer; an electrode formed above the active layer; a current spreading layer formed between the active layer and the electrode, having n-type conductivity, having a larger bandgap energy than the active layer, and spreading electrons injected from the electrode in the plane of the active layer; and a surface processed layer formed on the current spreading layer, having a larger bandgap energy than the active layer, and having an uneven surface region with a large number of concave-convex structures, wherein the electrode is not formed on the uneven surface region, and wherein the conduction band edge energy from the Fermi level of the surface processed layer is higher than that of the current spreading layer.

According to another aspect of the invention, there is provided a semiconductor light emitting device including: an active layer; an electrode formed above the active layer; a current spreading layer formed between the active layer and the electrode, having p-type conductivity, having a larger bandgap energy than the active layer, and spreading holes injected from the electrode in the plane of the active layer; and a surface processed layer formed on the current spreading layer, having a larger bandgap energy than the active layer, and having an uneven surface region with a large number of concave-convex structures, wherein the electrode is not formed on the uneven surface region, and wherein the conduction band edge energy from the Fermi level of the surface processed layer is higher than that of the current spreading layer.

According to another aspect of the invention, there is provided a semiconductor light emitting device including: an active layer; a current spreading layer formed above the active layer, having a larger bandgap energy than the active layer, and spreading injected carriers in the plane of the active layer; an intermediate layer formed on the current spreading layer, having a larger bandgap energy than the active layer, and having a lower Al composition than the current spreading layer; a surface processed layer formed on the intermediate layer, and having an uneven surface region in which a large number of concave-convex structures are formed at its surface; and an electrode formed on a region except the uneven surface region of the surface processed layer, and injecting the carriers to operate, wherein the surface processed layer having a higher conduction band edge energy from the Fermi level than that of the intermediate layer, or wherein the surface processed layer having a higher valence band edge energy from the Fermi level than that of the intermediate layer.

DETAILED DESCRIPTION OF THE INVENTION

Embodiments of the invention will now be described with reference to the drawings.

Figure 1:
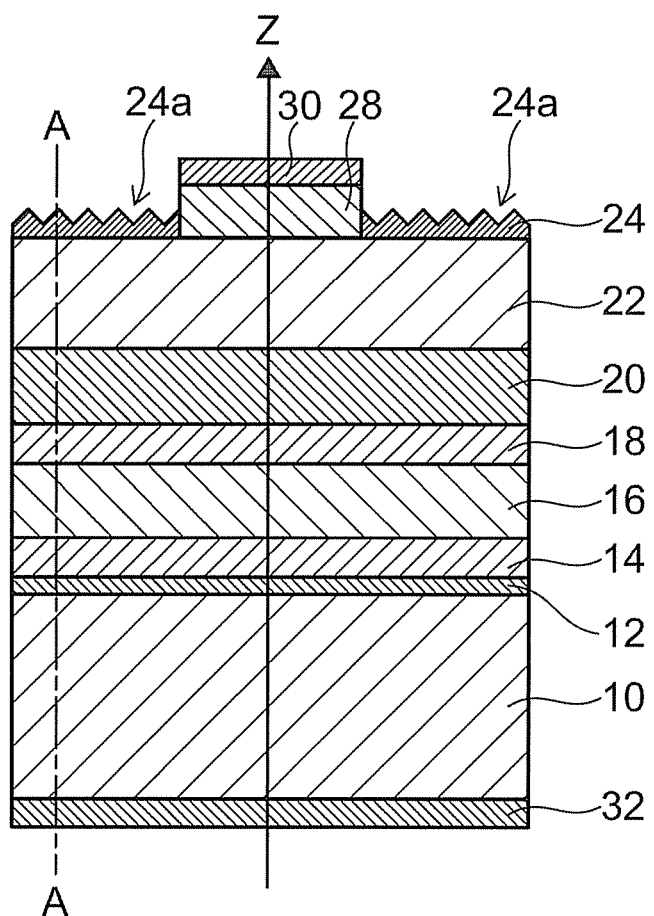
FIG. 1 is a schematic cross-sectional view of a semiconductor light emitting device according to a first embodiment.

FIG. 1 is a schematic cross-sectional view of a semiconductor light emitting device according to a first embodiment of the invention.

The semiconductor light emitting device includes a substrate 10 illustratively made of p-type GaAs, on which a heterobarrier-lowering layer 12 of p-type InGaP, a reflecting layer 14 of p-type $In_{0.5}Al_{0.5}P$/InGaAlP, a cladding layer 16 of p-type $In_{0.5}Al_{0.5}P$, an active layer 18 made of quantum wells of p-type InGaAlP, a cladding layer 20 of n-type $In_{0.5}Al_{0.5}P$, a current spreading layer 22 of n-type conductivity, and a surface processed layer 24 of n-type $In_{0.5}(Ga_{0.3}Al_{0.7})_{0.5}P$ formed in this order. Crystal growth technique such as MOCVD (metal organic chemical vapor deposition) or MBE (molecular beam epitaxy) can be used to grow the structure described above. The current spreading layer 22 can be made of InGaAlP-based or AlGaAs-based material. In FIG. 1, the current spreading layer 22 is made of $In_{0.5}(Ga_{0.7}Al_{0.3})_{0.5}P$.

If the lattice constant of an InGaAlP-based material is significantly different from that of GaAs, a misfit dislocation is induced into the InGaAlP layer, resulting in deterioration of InGaAlP crystallinity. Hence, the deviation in lattice constant of InGaAlP with respect to the GaAs substrate is preferably controlled within ±0.2%, which is realized by an In composition ratio of approximately 0.5. Thus, in this disclosure, notation of the Al composition ratio x, such as InGaAlP (x=0.3), indicates that the In composition ratio is 0.5, representing the composition $In_{0.5}(Ga_{0.7}Al_{0.3})_{0.5}P$. The parenthesized notation also represents the range of the composition ratio x, such as $0.44 < x \leq 1$. The In composition ratio of InGaAlP-based materials is not limited to 0.5.

The fine mesa concave-convex structures 24a are formed by combination of one time photo-lithography and one time RIE (Reactive Ion Etching) process on the surface processed layer 24 except the region below an n-side electrode 30. A contact layer 28 of n-type GaAs is selectively grown on the region where the surface processed layer 24 is not formed. An n-side electrode 30 is formed on the contact layer 28, and a p-side electrode 32 is formed on the backside of the substrate 10. The mesa concave-convex structures indicate the concave-convex structures including mesa parts and/or cones.

In the case where the n-side electrode 30 side of the semiconductor light emitting device is used as a light extraction surface, the light extraction surface is usually covered and sealed with a transparent resin. For example, as the semiconductor layer has a refractive index of 3.3 and the transparent resin has a refractive index of 1.5, the critical angle is calculated to be approximately 27 degrees based on the Snell's law. Without the mesa concave-convex structures, the total internal reflection takes place for the light whose incident angle is greater than this critical angle. The mesa concave-convex structures 24a formed at the surface of the surface processed layer 24 make the graded refractive index region from the semiconductor layer toward the transparent resin. Thus, the total internal reflection at the interface between the surface processed layer 24 and the transparent resin can be reduced, and the light extraction efficiency can be improved. Hence, formation of the mesa concave-convex structures 24a of this embodiment can increase the light extraction efficiency by a factor of approximately 1.5.

The laminated structure of FIG. 1 is now described.

The heterobarrier-lowering layer 12 is made of InGaP, illustratively with a carrier concentration of $1 \times 10^{18}$ cm$^{-3}$ or more, and with a thickness between 0.01 and 0.1 μm. It prevents the voltage drop due to the valence band heterobarrier between GaAs and InGaAlP. Since the valence band heterobarrier at the interface between GaAs and InGaAlP is high and a hole has a greater effective mass than that of an electron, the large voltage drop at the interface induces operating voltage increase of the semiconductor light emitting device without the heterobarrier-lowering layer.

In the active layer 18, the Al compositions in the barrier layer and the well layer constituting the quantum well structure are adjusted to be the emission wavelength of approximately 620 nm corresponding to the bandgap energy of 2.0 eV. The reflecting layer 14 is made of a multilayer structure of $In_{0.5}Al_{0.5}P$ and InGaAlP, and reflects upward the light of approximately 620 nm emitting from the active layer 18.

The current spreading layer 22 has a sufficiently low resistivity so that electrons injected from the n-side electrode 30 are widely spread in the device plane. For this purpose, the current spreading layer 22 has a relatively high carrier concentration of e.g. $1 \times 10^{18}$ cm$^{-3}$. Furthermore, the bandgap energy of the current spreading layer 22 is made of the material whose bandgap energy is larger than that of the active layer 18 (2.0 eV) to prevent absorption of the light emitting from the active layer 18. For example, if the current spreading layer 22 is made of InGaAlP (x=0.3), its bandgap energy is 2.09 eV.

In this embodiment, while the Al compositions of the barrier layer and the well layer constituting the quantum well structure are adjusted to be the emission wavelength of 620 nm, the emission wavelength can be set flexibility. For example, the yellow emission with the wavelength of approximately 590 nm can be achieved by using InGaAlP (x~0.25) as the well layer and InGaAlP (x: approximately 0.4 to 0.6) as the barrier layer in the quantum well structure of the active layer. The green emission with the wavelength of approximately 570 nm can be achieved by using InGaAlP (x~0.4) as the well layer and InGaAlP (x~0.6) as the barrier layer in the quantum well structure of the active layer. In the case in which the emission in a longer wavelength region is desired, the red emission with the wavelength of about 650 nm can be achieved by using InGaAlP (x~0) as the well layer and InGaAlP (x: approximately 0.2 to 0.6) as the barrier layer in the quantum well structure of the active layer. Moreover, in the case in which the infrared emission is desired, the emission wavelength can be adjusted in the range of 700 nm to 900 nm by using GaAs or GaAlAs as the well layer of the active layer. The barrier layer for achieving the infrared emission may be based on either InGaAlP (x: approximately 0 to 0.6) or GaAlAs. Not only the quantum well structure but also a single layer structure or the other structure can be used for the active layer.

The emission wavelength can be set flexibility in a wide range from green~yellow~red to infrared, and the reflecting layer 14 is designed according to the emission wavelength. The current spreading layer 22 is selected from the material having a larger bandgap energy than the active layer.

Figure 2A:
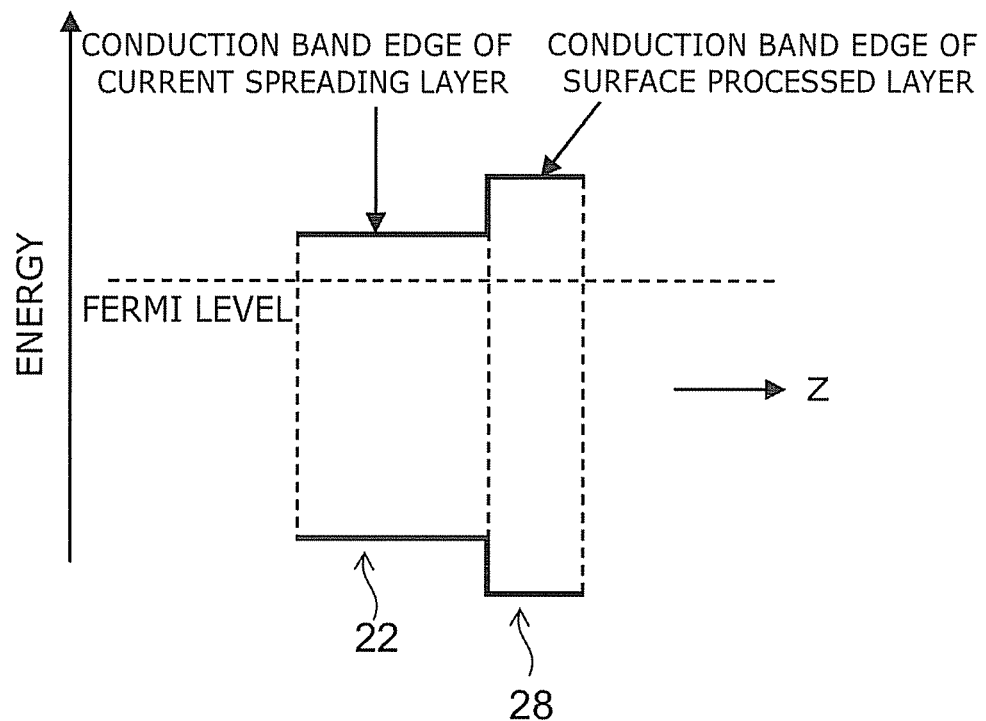
FIGS. 2A and 2B are schematic diagrams of the band structure of the surface processed layer and the current spreading layer.
Figure 2B:
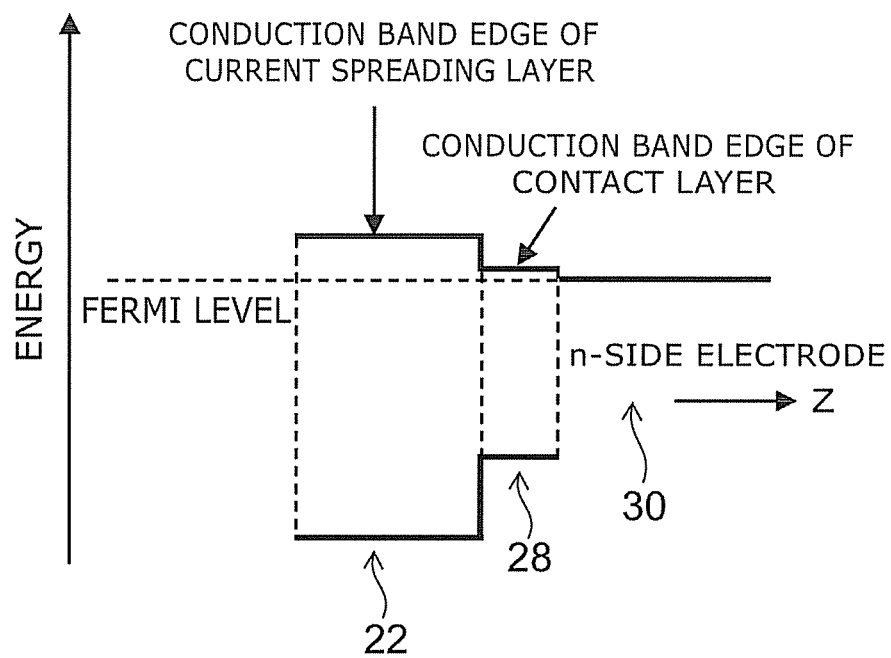

FIGS. 2A and 2B are band diagrams, in which the vertical axis represents energy, and the horizontal axis represents relative position parallel to the central Z axis of FIG. 1. FIG. 2A shows energy along the Z axis, and FIG. 2B shows energy along the line A-A parallel to the Z axis.

In FIG. 2A, the conduction band edge energy of the surface processed layer 24 is larger than that of the current spreading layer 22, so that there exists the barrier between the two layers. Thus, electrons flowing into the current spreading layer 22 can be suppressed to spread into the surface processed layer 24. In FIG. 2B, the current spreading layer 22 is directly in contact with the contact layer 28. In the conduction band, electrons injected from the n-side electrode 30 flow into the current spreading layer 22 through the contact layer 28, and there is no barrier for electrons.

Next, the relationship between the band edge energies of the current spreading layer 22 and the surface processed layer 24 is described in more detail. To compare the level of conduction band edge energy from the Fermi level between different semiconductor materials, the band discontinuity of each material with respect to GaAs can be used as a reference. As the Fermi level changes depending on the carrier concentration, the Fermi level in the n-type semiconductor approaches to the conduction band edge with increasing the carrier concentration. Assuming that the carrier concentration in the surface processing layer 24 is almost similar to that in the current spreading layer 22, the energy difference between the conduction band edges of the surface processed layer 24 and the current spreading layer 22 from the Fermi level is almost similar to that from the conduction band edge from the GaAs.

Figure 3A:
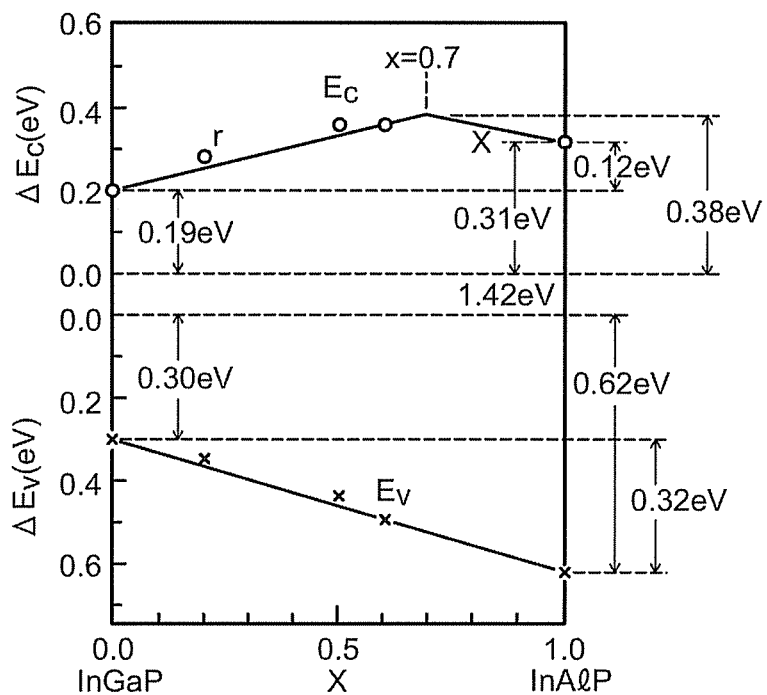
FIGS. 3A and 3B are graphs showing the compositional dependence of band discontinuity.
Figure 3B:
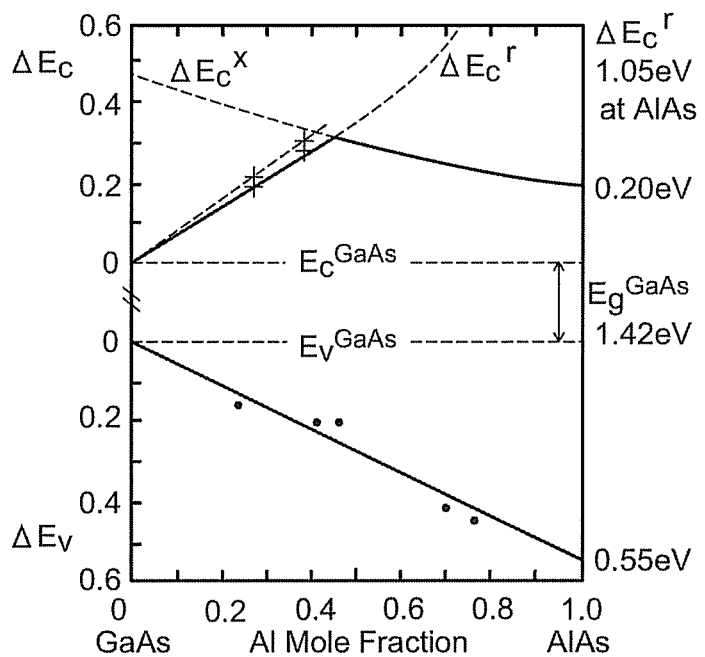

FIGS. 3A and 3B show the compositional dependences of band discontinuity respect to GaAs. In FIG. 3A, the vertical axis represents the band discontinuity of the conduction band, $\Delta Ec$ (eV), and the band discontinuity of the valence band, $\Delta Ev$ (eV), between InGaAlP and GaAs, and the horizontal axis represents Al composition x (Non-Patent Document 1). For example, the conduction band discontinuity $\Delta Ec$ between InGaAlP (x=0.7) and GaAs is 0.38 eV, and $\Delta Ec$ between InGaAlP (x=0.3) and GaAs is 0.27 eV. Thus, the conduction band edge energy of InGaAlP (x=0.7) is 0.11 eV larger than that of InGaAlP (x=0.3). The compositions of the surface processed layer 24 and the current spreading layer 22 in this embodiment are set as described above, with a carrier concentration of $1\times10^{18}$ cm$^{-3}$ in the both layer. Thus, the energy difference from the conduction band edge of GaAs is almost similar to that from the Fermi level.

In the case where the current spreading layer 22 is made of InGaAlP (x=0.3), it is clear from FIG. 3A that the conduction band edge energy of the surface processing layer 24 can be set higher than that of the current spreading layer 22 if the surface treated layer 24 is made of InGaAlP ($0.3<x\leq 1$). The inventors have found that electrons flowing into the current spreading layer 22 can be effectively suppressed from diffusing into the surface processed layer 24 if the conduction band edge energy difference is 0.04 eV or more. This indicates that a more preferable range of the Al composition is $0.44\leq x\leq 1$. If the surface processing layer 24 is made of In$_{0.5}$Al$_{0.5}$P, the conduction band edge energy of the surface processed layer 24 can be set 0.04 eV higher than that of the current spreading layer 22.

Furthermore, instead of InGaAlP, the surface processed layer 24 can be made of GaAlAs-based materials. In FIG. 3B, the vertical axis represents the band discontinuity $\Delta Ec$ (eV), $\Delta Ev$ (eV) between Ga$_{1-x}$Al$_x$As and GaAs, and the horizontal axis represents Al composition x (Non-Patent Document 2). In the case in which the current spreading layer 22 is made of InGaAlP (x=0.3), the conduction band discontinuity with respect to GaAs is 0.27 eV. Thus, Ga$_{1-x}$Al$_x$As ($0.5\leq x\leq 0.65$) can be used as the surface processed layer with a larger bandgap energy than the active layer 18. To suppress electrons flowing from the current spreading layer 22 into the surface processed layer 24, the energy difference at the conduction band edge is preferably at least 0.04 eV or more. Hence, it is more preferable that Al composition x is set to be near 0.5. As described above, the appropriate Al composition of the surface processed layer 24 can be determined from FIG. 3 according to the Al composition of the current spreading layer 22.

This embodiment has been described with reference to the case in which the surface processed layer 24 of In$_{0.5}$(Ga$_{0.3}$Al$_{0.7}$)$_{0.5}$P is n-type. However, the p-type surface processed layer 24 can be used if it is not formed between the electrode 30 and the current spreading layer 22. In the case of p-type In$_{0.5}$(Ga$_{0.3}$Al$_{0.7}$)$_{0.5}$P, the Fermi level comes close to the valence band side. Hence, the conduction band discontinuity between the surface processing layer 24 and the current spreading layer 22 becomes relatively large, and diffusion of electrons into the surface processing layer 24 can be suppressed more effectively. To prevent degradation of device characteristics due to the diffusion of p-type dopant from the surface processing layer 24 to the current spreading layer 22, and to minimize the thickness of the depletion layer formed at the n/p interface between the surface processed layer and the current spreading layer 22, the p-type doping concentration in the surface processed layer needs to be set lower. For example, preferably, it is set to be approximately $5\times10^{16}$ cm$^{-3}$. In addition, the undoped surface processed layer 24 can be used if it is not formed between the electrode 30 and current spreading layer 22.

Effects of the surface processed layer 24 having a higher conduction band edge energy than that of the current spreading layer 22, and having mesa concave-convex structures 24a on its surface, will be described below.

Figure 4:
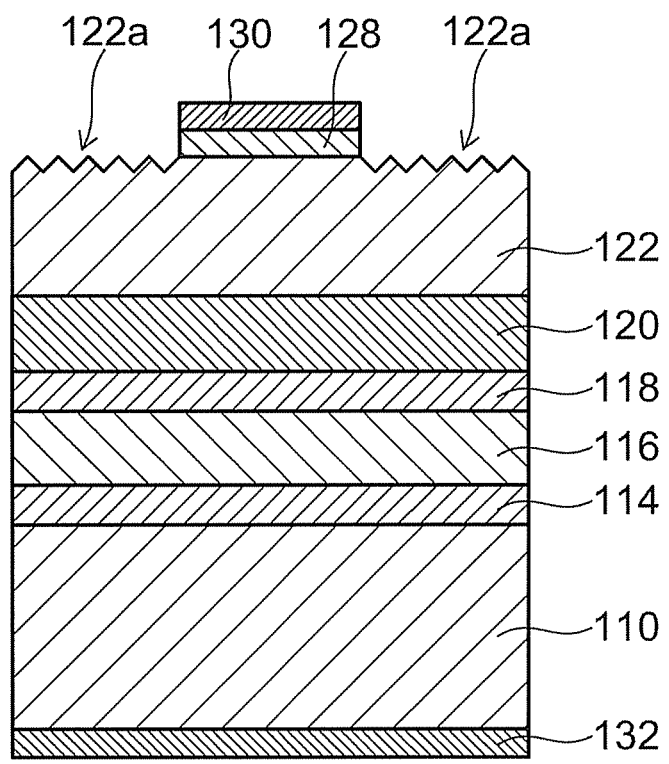
FIG. 4 is a schematic cross-sectional view of a semiconductor light emitting device according to the comparative example.

FIG. 4 is a schematic cross-sectional view of a semiconductor light emitting device according to the comparative example in which concave-convex structures are formed at the surface of the current spreading layer. A substrate 110 of p-type GaAs, a reflecting layer 114 of p-type In$_{0.5}$Al$_{0.5}$P/ InGaAlP, a cladding layer 116 of p-type In$_{0.5}$Al$_{0.5}$P, an active layer 118 having a p-type InGaAlP quantum well structure, a cladding layer 120 of n-type In$_{0.5}$Al$_{0.5}$P, a current spreading layer 122 of n-type InGaAlP (x=0.3), and a contact layer 128 of n-type GaAs are formed in this order. An n-side electrode 130 is formed on the contact layer 128, and a p-side electrode 132 is formed on the backside of the substrate 110.

The semiconductor light emitting device of the comparative example degrades in brightness by operating test of 168H at high temperature. For instance, the brightness may decrease to 80% or less of its initial value after 168H. The inventors have found that this degradation is caused by the RIE processing damage in formation of the mesa concave-convex structures 122a at the surface. More specifically, the RIE processing damage in the surface of the current spreading layer 122 produces deep levels in the bandgap. The current flowing through the current spreading layer significantly increases the density of deep levels, which absorb the light emitted from the active layer, causing the brightness degradation. Furthermore, it has also been found that InGaAlP is more sensitive to processing damage than InGaAlN, resulting in more significant brightness degradation by the operating test. In contrast, in the first embodiment, the conduction band edge energy of the surface processed layer 24, which is sensitive to processing damage, is higher than that of the current spreading layer 22. Hence, electrons are less likely to be injected into the surface processed layer 24, and the increase of the density of deep levels induced by the RIE process is effectively suppressed. Thus, the brightness degradation by the operating test can be prevented, and also the light extraction efficiency can be improved. For example, the brightness can be stably maintained for 1000 hours or more.

Figure 5:
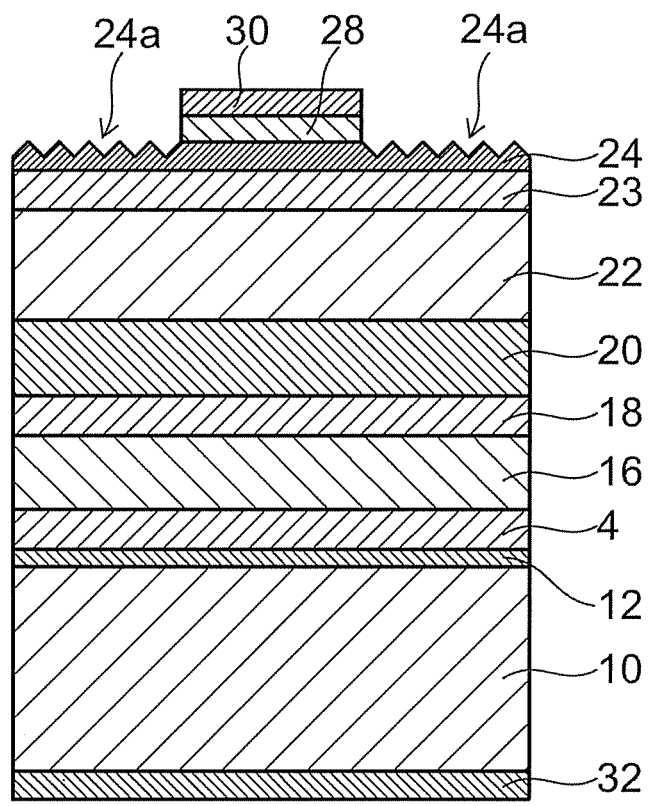
FIG. 5 is a schematic cross-sectional view of a semiconductor light emitting device according to a second embodiment.

FIG. 5 is a schematic cross-sectional view of a semiconductor light emitting device according to a second embodiment.

The substrate 10, the heterobarrier-lowering layer 12, the reflecting layer 14, the cladding layer 16, the active layer 18, and the cladding layer 20 have almost the same Al compositions as those of the first embodiment. The current spreading layer 22 is made of n-type Ga$_{0.2}$Al$_{0.8}$As, an intermediate layer 23 is made of n-type $Ga_{0.5}Al_{0.5}As$, and the surface processed layer 24 is made of n-type InGaAlP (x=0.7). A contact layer 28 of GaAs and an n-side electrode 30 are formed on the surface processed layer 24.

The bandgap of the current spreading layer 22 is larger than that of the active layer corresponding to the emission wavelength (2.0 eV), and its carrier concentration is $1 \times 10^{18}$ cm$^{-3}$. The Al composition x of this current spreading layer 22 is as high as 0.8. Thus, the current spreading layer 22 is easy to oxidize and degradate if it is located near the surface. The intermediate layer 23, whose Al composition (e.g., 0.5) is lower than that of the current spreading layer 22 (x=0.8), is preferably formed between the surface processed layer 24 and the current spreading layer 22 to prevent oxidation of the current spreading layer with high Al composition.

In this embodiment, the material of the surface processed layer 24 is selected by considering the band edge of the intermediate layer 23. From FIG. 3B, the conduction band edge energy discontinuity of n-type $Ga_{0.5}Al_{0.5}As$ with respect to GaAs is approximately 0.31 eV. Hence, in the case in which the surface processed layer 24 is made of InGaAlP, its Al composition ratio x of $0.44 < x \leq 1$ is preferable from FIG. 3A. The Al composition range of $0.59 \leq x \leq 0.8$, which allows the conduction band edge energy difference to be 0.04 eV or more, is more preferable because the current can be effectively suppressed flowing from the intermediate layer to the surface processed layer 24.

Thus, in the case in which the surface processed layer 24 is made of n-type InGaAlP (x=0.7), its conduction band edge energy from the Fermi level can be larger than that of the intermediate layer 23 of n-type $Ga_{0.5}Al_{0.5}As$. The bandgap energy of the surface processed layer 24 with this Al composition is 2.32 eV, which is larger than that of the active layer 18, 2.0 eV. Hence, no brightness decrease occurs due to optical absorption in the surface processed layer 24. The carrier concentrations of the current spreading layer 22, the intermediate layer 23, and the surface processed layer 24 are all set to be $1 \times 10^{18}$ cm$^{-3}$, for example.

The film thickness is 2.5 μm for the current spreading layer 22, 500 nm for the intermediate layer 23, and 400 nm for the surface processed layer 24, for example. The surface processed layer 24 preferably has a thickness of 300 nm or more for formation of the concave-convex structures. On the other hand, the increase of film thickness results in increasing the series resistance of the light emitting device and increasing the operating voltage. Hence, to enhance the light extraction efficiency with preventing the increase of series resistance, the film thickness of the surface processed layer 24 is preferably in the thickness range between 300 nm and 600 nm.

The second embodiment is different from the first embodiment for two points. In the second embodiment, the surface processed layer 24 exists between the n-side electrode 30 and the current spreading layer 22, and the intermediate layer 23 is formed on the current spreading layer. In this case, the surface processed layer 24 needs to be of n-type. The resistivity of the surface processed layer 24 is higher than that of the intermediate layer 23 and the current spreading layer 22, and the thickness of the surface processed layer 24 is as thin as 400 nm. Therefore, electrons injected from the n-side electrode 30 from are prevented to spread laterally. Electrons are spreading laterally in the thick current spreading layer 22, and suppressed to flow into the mesa concave-convex structures 24a having the RIE processing damage.

Furthermore, the conduction band edge energy of the surface processed layer 24, which is sensitive to processing damage, is higher than that of the current spreading layer 22, preventing the lateral current spreading in the surface processed layer 24. Hence, the increase of the density of deep levels due to the RIE processing damage is effectively suppressed, and the brightness degradation by the operating test can be prevented. For example, the brightness can be stably maintained for 1000 hours or more. Furthermore, it is confirmed the intermediate layer 23 with a low Al composition prevents oxidation of the current spreading layer 22 with a high Al composition.

FIG. 6 is a schematic cross-sectional view of a semiconductor light emitting device according to a third embodiment.

Figure 6A:
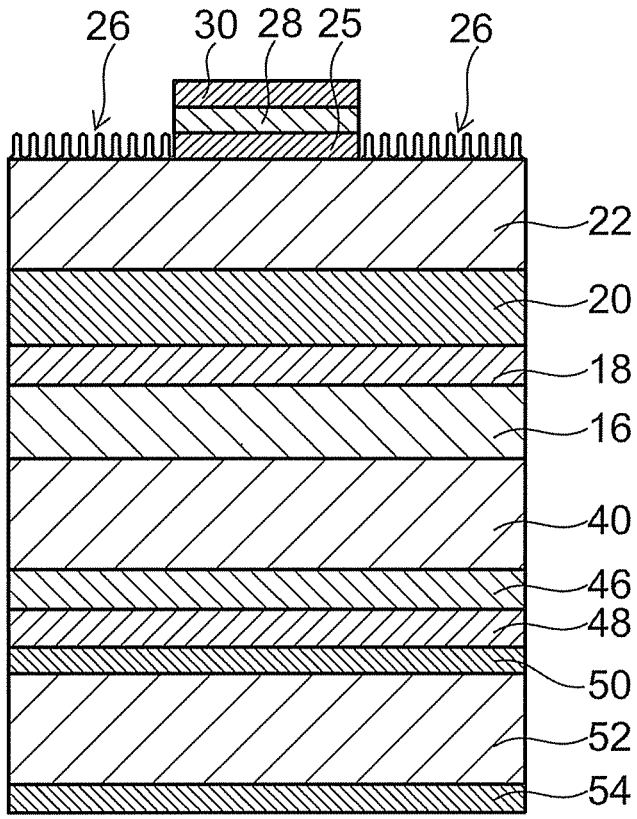
FIGS. 6A through 6C are schematic cross-sectional views of a semiconductor light emitting device according to a third embodiment.
Figure 6B:
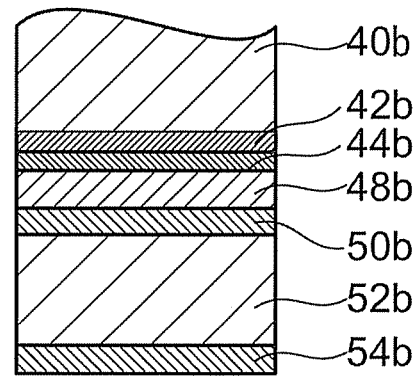

This embodiment has a structure in which an Au electrode 50, 50b formed on a substrate 52 of Si is bonded to an Au electrode 48, 48b formed on an InGaAlP material. FIG. 6A shows the central region of the device including the n-side electrode 30, and FIG. 6B shows the surrounding region of the central region. The central region of FIG. 6A includes an $SiO_2$ layer 46 adjacent to the Au electrode 48, a current spreading layer 40 of p-type InGaAlP (x=0.3), a cladding layer 16 of p-type $In_{0.5}Al_{0.5}P$, an active layer 18 made of a p-type InGaAlP quantum well, a cladding layer 20 of n-type $In_{0.5}Al_{0.5}P$, a current spreading layer 22 of n-type InGaAlP (x=0.3), a surface processed layer 25 of n-type InGaAlP (x=0.7), a contact layer 28 of n-type GaAs, and an n-side electrode 30.

In the surrounding region of FIG. 6B, the $SiO_2$ layer is removed and replaced by a heterobarrier-lowering layer 42b of p-type $In_{0.5}Ga_{0.5}P$ adjacent to the current spreading layer 40b, and a contact layer 44b of p-type GaAs. The $SiO_2$ layer 46 in the central region and the contact layer 44b in the surrounding region are coated with the Au electrode 48, 48b, and the Au electrode 48b in the surrounding region acts as a p-side electrode. A large number of p-side electrodes are discretely placed in the surrounding region and makes the current spread more effectively in the device plane. Since the $SiO_2$ layer 46 is formed below the n-side electrode 30, the current flows through the p-side electrodes in the surrounding region to the n-side electrode 30. The current spreading layers 40 and 40b, the Au electrodes 48 and 48b, the Au electrodes 50 and 50b, the substrates 52 and 52b, and the backside electrodes 54 and 54b, respectively, are continuous with each other. The letter "b" indicates that it is in the surrounding region.

Because the $SiO_2$ layer 46 is formed in a region directly below the n-side electrode 30, the current does not flow downward in the central region. This structure suppresses ineffective light emission from the active layer 18 in the region directly below the n-side electrode 30, because such light cannot be sufficiently extracted outside the device by blocking the n-side electrode 30. Furthermore, the $SiO_2$ layer 46 reflects the light from the active layer 18 with total internal reflection and contributes to external extraction of light propagating below the n-side electrode 30.

As the area of the $SiO_2$ layer 46 on the backside is increased, the light extraction efficiency can be enhanced by total internal reflection of the light emitting from the active layer 18. However, if the area of the p-side electrodes in the surrounding region is too small, the contact resistance increases resulting in the operating voltage increases. Hence, the area ratio of the SiO2 layer and the p-side electrode must be adjusted taking account of the light extraction efficiency enhancement and the operating voltage increase. A backside electrode 54, 54b illustratively made of a layered structure of Ti/Pt/Au is formed on the side opposed to the Au electrode 50, 50b across the substrate 52. In the first and second embodiment, there exists loss due to optical absorption in the substrate 10 of GaAs. In contrast, in this embodiment, total internal reflection by the SiO$_2$ layer 46 reduces optical absorption and loss, resulting in achieving high brightness.

Figure 6C:
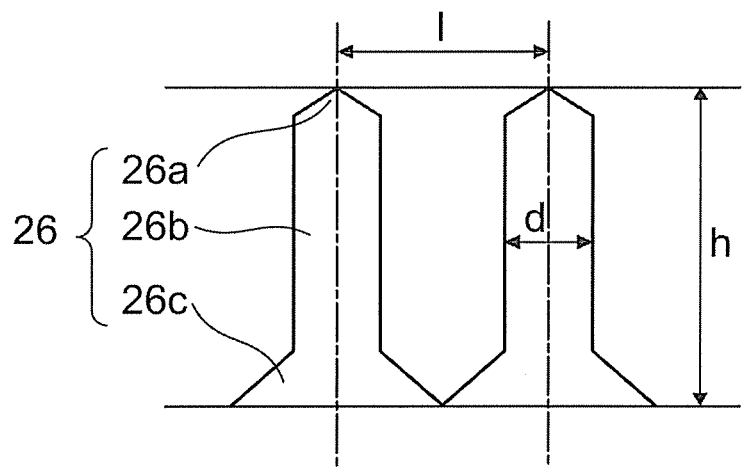

Furthermore, the concave-convex structures at the surface of the surface processed layer 25 in this embodiment are nanometer-sized. More specifically, the nanometer-sized concave-convex structure 26 includes a nanometer-sized mesa part 26c, a nanometer-sized cylinder 26b, and a nanometer-sized corn 26a formed by RIE (reactive ion etching) processing. This structure improves light extraction efficiency by graded refractive index, and additionally, by diffraction. The height h, the diameter d of the cylinder, and the spacing I of the nanometer-sized concave-convex structure as shown in FIG. 6C must be designed by taking account of the emission wavelength. For example, for red light with a wavelength from 610 to 640 nm, high light extraction efficiency can be achieved with the nanometer-sized concave-convex structure in which d and l are both set in the range between 100 and 200 nm and h is set in the range between 300 and 600 nm. In the case in which the surface processed layer 25 is made of InGaAlP, and in which the height h is set in the range between 400 and 500 nm, the light extraction efficiency with the nanometer-sized concave-convex structures can be improved twice or more as compared with that without the nanometer-sized concave-convex structures.

In the active layer 18, the Al composition in the barrier layer and the well layer is adjusted to be the emission wavelength of 620 nm (corresponding to bandgap energy of 2.0 eV). The p-type current spreading layer 40 and the n-type current spreading layer 22 spread the current injected from the electrode in the device plane. The both layers have sufficiently low resistivity with a carrier concentration of $1\times10^{18}$ cm$^{-3}$. Furthermore, the bandgap energy of the current spreading layer 40, 22 is larger than that of the active layer (2.0 eV) to prevent absorption of the light emitting from the active layer 18.

In the case in which the current spreading layer 22 is made of InGaAlP (x=0.3) and the surface processed layer 25 is made of InGaAlP (0.3<x≦1), the conduction band edge energy of the surface processed layer 25 can be set higher than that of the current spreading layer 22, and the current diffusion into the surface processed layer 25 can be suppressed. If the conduction band edge energy difference is set to be 0.04 eV or higher by setting Al composition for 0.44≦x≦1, the current diffusion into the surface processed layer 25 can be suppressed much more effectively. Furthermore, the bandgap energy of the surface processed layer 25 is higher than that of the active layer 18 (2.0 eV). Thus, the light emitting from the active layer 18 is not absorbed by the surface processed layer 25, and there is no decrease in brightness.

As described in the first embodiment, the emission wavelength of the active layer is not limited to be 620 nm, and it can be set flexibility in the wide range from green~yellow~red to infrared. The material of the current spreading layer must be selected in taking account of the emission wavelength of the active layer.

The formation of nanometer-sized concave-convex structures 26 requires several times of RIE process, therefore a larger amount of the RIE damage may be induced as compared with the mesa concave-convex structures, in which the number of RIE process is usually one time, as described in the first embodiment. The inventors replaced the mesa concave-convex structures of the light emitting device of the comparative example shown in FIG. 4 by the nanometer-sized concave-convex structures, and compared the brightness degradation by the 168-hour operating test. It was found that the brightness of the light emitting device with the nanometer-sized concave-convex structures decreased to 70% or less of its initial brightness. The brightness degradation is larger than that of the light emitting device with the mesa concave-convex structures (80% or less of its initial value).

By contrast, no electron is injected into the surface processed layer 25 having RIE processing damage in this embodiment. Thus, the increase in the density of deep levels induced by RIE process is suppressed, and the brightness degradation by the operating test can be prevented. Hence, this embodiment with the nanometer-sized concave-convex structures 26 can realize a semiconductor light emitting device with higher light extraction efficiency and improved reliability. The nanometer-sized concave-convex structures can be replaced by a mesa concave-convex structures. In that case, the process for forming the concave-convex structures can be simplified, although the improvement in light extraction efficiency with the mesa concave-convex structures is lower than that with the nanometer-sized concave-convex structures. Hence, either structure can be selected in accordance with application.

Figure 7:
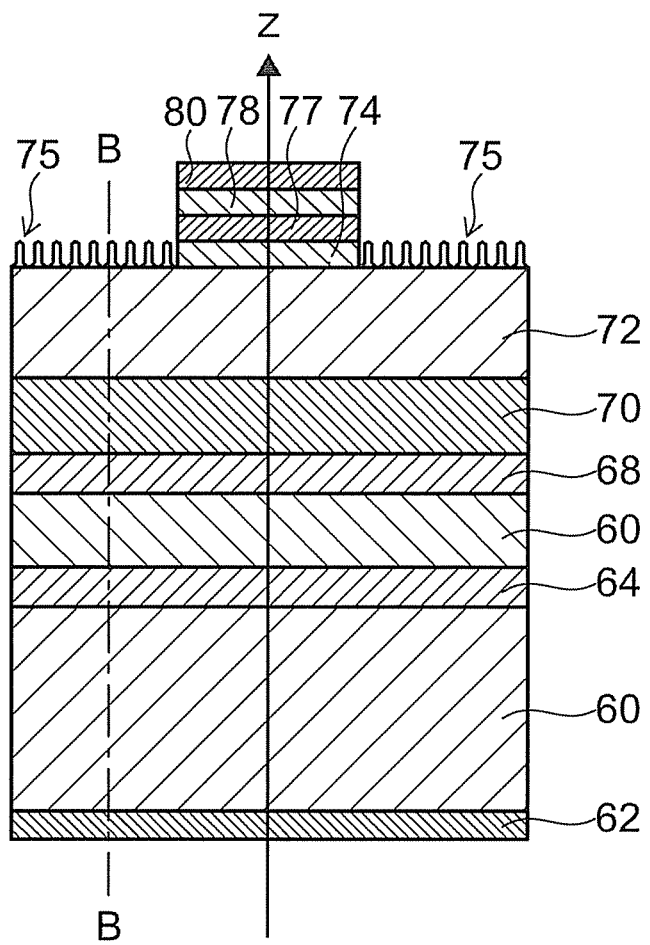
FIG. 7 is a schematic cross-sectional view of a semiconductor light emitting device according to a fourth embodiment.

FIG. 7 is a schematic cross-sectional view of a semiconductor light emitting device according to a fourth embodiment.

A substrate 60 of n-type GaAs, a reflecting layer 64 of n-type In$_{0.5}$Al$_{0.5}$P/InGaAlP, a cladding layer 66 of n-type In$_{0.5}$Al$_{0.5}$P, an active layer 68 made of a p-type InGaAlP quantum well, a cladding layer 70 of p-type In$_{0.5}$Al$_{0.5}$P, a current spreading layer 72 of p-type Ga$_{0.2}$Al$_{0.8}$As, a surface processed layer 74 of p-type InGaAlP (x=0.7), a heterobarrier-lowering layer 77 of p-type In$_{0.5}$Ga$_{0.5}$P, and a contact layer 78 of p-type GaAs are formed in this order. A p-side electrode 80 is formed on the contact layer 78, and an n-side electrode 62 is formed on the backside of the substrate 60.

In the active layer 68, the Al composition in the barrier layer and the well layer is adjusted to be the emission wavelength of 620 nm. The reflecting layer 64 has a multilayer structure of In$_{0.5}$Al$_{0.5}$P and InGaAlP to reflect the light emitting from the active layer 68. The current spreading layer 72 has a carrier concentration of $1\times10^{18}$ cm$^{-3}$, spreading the current injected from the electrode in the device plane due to its sufficiently low resistivity. Furthermore, the bandgap energy of the current spreading layer 72 is larger than that of the active layer with the emission wavelength (2.0 eV), to prevent absorption of the light emitting from the active layer 68.

As described in the first embodiment, the emission wavelength of the active layer is not limited to be 620 nm, however, and it can be set flexibility in the wide range from green~yellow~red to infrared. The material of the current spreading layer can be selected according to the emission wavelength of the active layer.

The valence band edge energy of the surface processed layer 74 from the Fermi level is larger than that of the current spreading layer 72. Furthermore, the bandgap energy of the surface processed layer 74 is larger than the that of the active layer 68 to prevent absorption of the light emitting from the active layer 68. Thus, there is no decrease in brightness. The carrier concentration in the surface processed layer 74 is almost same to the carrier concentration in the current spreading layer 72 of $1\times10^{18}$ cm$^{-3}$.

At the device upper surface used as a light extraction surface, nanometer-sized concave-convex structures 75, which are almost the same configuration as those in the third embodiment, are formed outside the p-side electrode 80. As compared with the case of no nanometer-sized concave-convex structure, the light extraction efficiency with the nanometer-sized concave-convex structures can be improved by a factor of approximately two. If the nanometer-sized concave-convex structures are replaced by the mesa concave-convex structures, the light extraction efficiency is improved by a factor of approximately 1.5 as compared with the case of no mesa concave-convex structure.

Figure 8A:
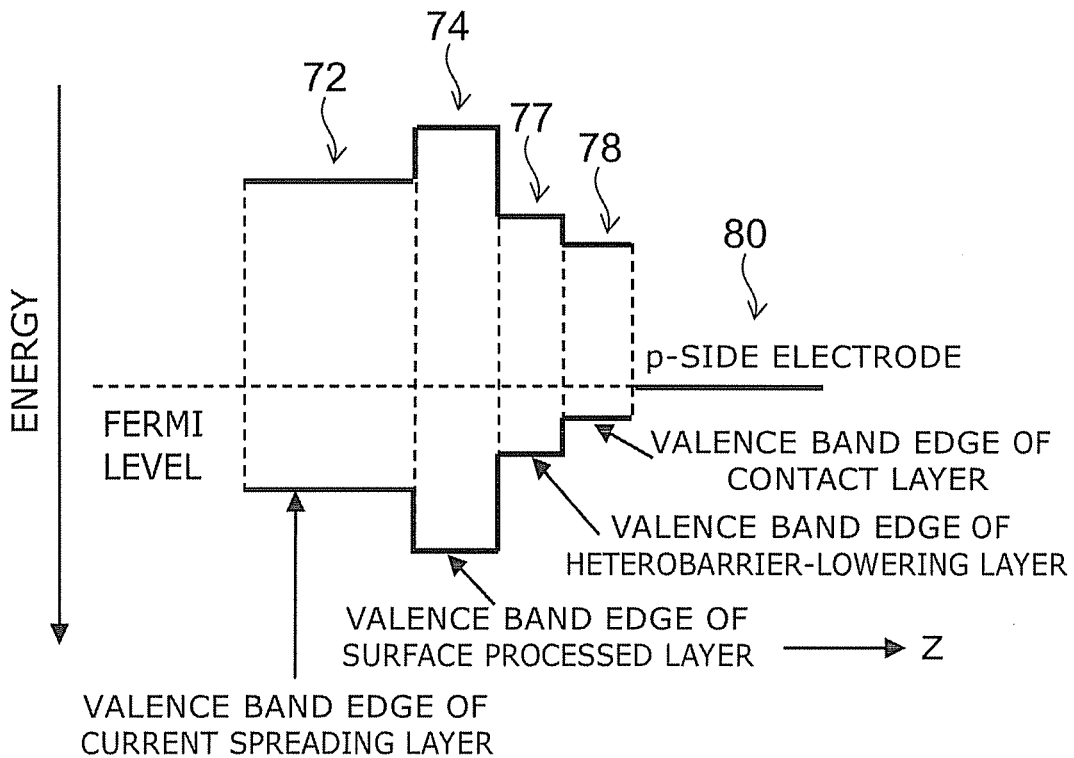
FIGS. 8A and 8B are schematic diagrams of the band structure of the surface processed layer and the current spreading layer.

FIG. 8 are schematic diagrams of the band structure illustrating the function of the surface processed layer 74. The vertical axis represents energy, and the horizontal axis represents relative position in the Z direction of FIG. 7. In this figure, since the energy of the valence band is illustrated, the direction of energy represented on the vertical axis is reverse direction compared with FIG. 2. FIG. 8A is a band diagram along the Z axis in the region where the p-side electrode 80 is formed. In the valence band, holes injected from the p-side electrode 80 flow into the current spreading layer 72 through the contact layer 78, the heterobarrier-lowering layer 77, and the surface processed layer 74. In the surface processed layer 74 of p-type InGaAlP (x=0.7), which has high resistivity, holes scarcely spread in the lateral direction.

Figure 8B:
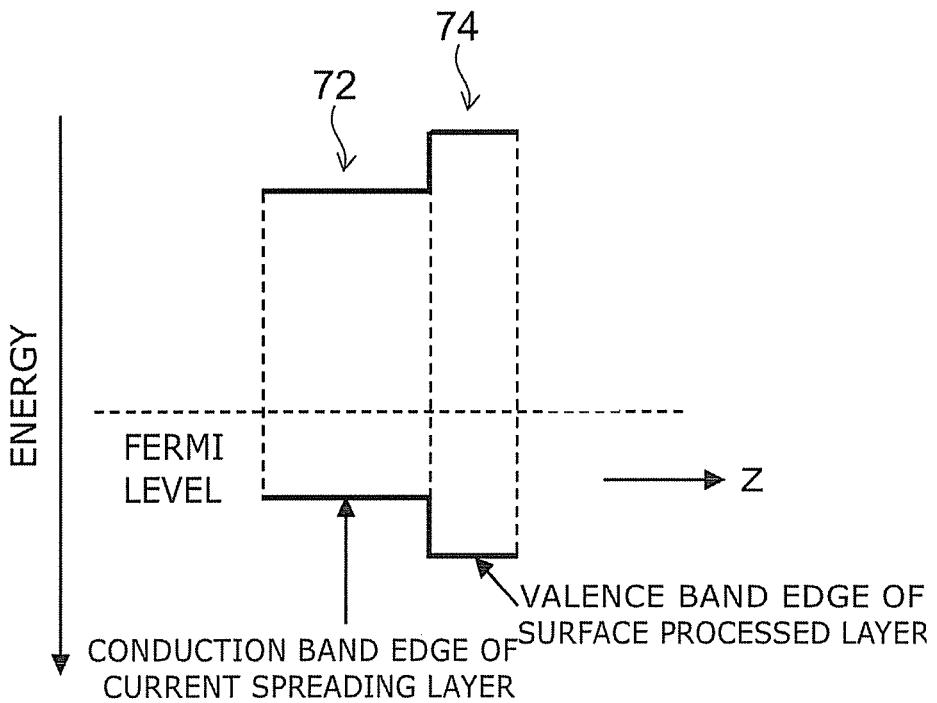

FIG. 8B is a band diagram along the line B-B in FIG. 7 in the region where the nanometer-sized concave-convex structures 75 are formed. The valence band edge energy of the surface processed layer 74 from the Fermi level is larger than that of the current spreading layer 72, and there exists the barrier at the valence band side of the interface between the surface processed layer 74 and the current spreading layer 72. Holes flowing into the current spreading layer 72 are suppressed to spread into the surface treated layer 74.

Also in this embodiment, FIG. 3 can be used to describe the band edge energy. In this case, in order to compare the level of valence band edge energy from the Fermi level between different semiconductor materials, the band discontinuity of each material with respect to GaAs can be used as a reference. The Fermi level is changed depending on the carrier concentration. In the p-type semiconductor, the Fermi level approaches to the valence band edge with increasing the carrier concentration. Assuming that the carrier concentration in the surface processed layer 74 is almost same to that in the current spreading layer 72, the energy difference between the valence band edges of the surface processed layer 74 and the current spreading layer 72 from the Fermi level is almost similar to that from the valence band edge from the GaAs.

For example, the surface processed layer 74 is made of p-type InGaAlP (x=0.7) and the current spreading layer 72 is made of p-type $Ga_{0.2}Al_{0.8}As$. The valence band discontinuity between the surface processed layer 74 and GaAs is 0.52 eV from FIG. 3A, and the valence band discontinuity between the current spreading layer 72 and GaAs is 0.44 eV from FIG. 3B. Thus, the valence band edge energy of the surface processed layer 74 is 0.08 eV larger than that of the current spreading layer 72. The concentration in the surface processed layer 74 is almost similar to that in the current spreading layer 72 of $1\times10^{18}$ $cm^{-3}$. Thus, the energy difference from the valence band edge of GaAs is almost similar to that from the Fermi level. The valence band edge energy with respect to GaAs can be used as a reference for selecting the material of the surface processed layer 74 having a high valence band edge energy from the Fermi level.

Thus, a preferable range of the Al composition x of the surface processed layer 74 can be determined for the current spreading layer 72 made of $Ga_{0.2}Al_{0.8}As$. It can be seen from FIG. 3A that $InGa_{1-x}Al_xP$ (0.44≦x) can be used for the surface processed layer 74 as a material whose valence band edge energy with respect to GaAs is larger than 0.44 eV. The inventors have found that the valence band edge energy difference is preferably 0.02 eV or higher to prevent holes in the current spreading layer 72 from spreading into the surface processed layer 74. A hole has a greater effective mass than an electron, and is less likely to spread compared with the electron, thus the valence band edge energy difference can be smaller than the conduction band edge energy difference. From this point of view, InGaAlP (0.50≦x) is more preferable for the surface processed layer.

Instead of InGaAlP, the surface processed layer 74 can be made of GaAlAs-based materials. In the case in which the current spreading layer 72 is made of $Ga_{0.2}Al_{0.8}As$, the surface processed layer 74 required to be made of $Ga_{1-x}Al_xAs$ with 0.8<x. However, $Ga_{1-x}Al_xAs$ with x exceeding 0.8 is easy to oxidize. Hence, InGaAlP is more preferable for the surface processed layer 74.

Although the surface treated layer 74 of $In_{0.5}(Ga_{0.3}Al_{0.7})_{0.5}P$ is of p-type in this embodiment, the surface treated layer 74 of n-type can be used if it is not formed between the p-side electrode 80 and the current spreading layer 72. As the Fermi level approaches to the conduction band side in n-type $In_{0.5}(Ga_{0.3}Al_{0.7})_{0.5}P$, the valence band discontinuity between the surface processed layer 74 and the current spreading layer 72 becomes relatively large, and diffusion of holes into the surface processed layer 74 can be suppressed more effectively. In order to prevent characteristics degradation due to the diffusion of n-type dopant from the surface processed layer 74 into the current spreading layer 72, and to minimize the thickness of the depletion layer formed at the n/p interface in the current spreading layer 72, the doping concentration must be set lower. For example, preferably, it is set to be approximately $5\times10^{16}$ $cm^3$. In addition, the undoped surface processed layer can be used if it is not formed between the p-side electrode 80 and the current spreading layer 72.

Figure 9:
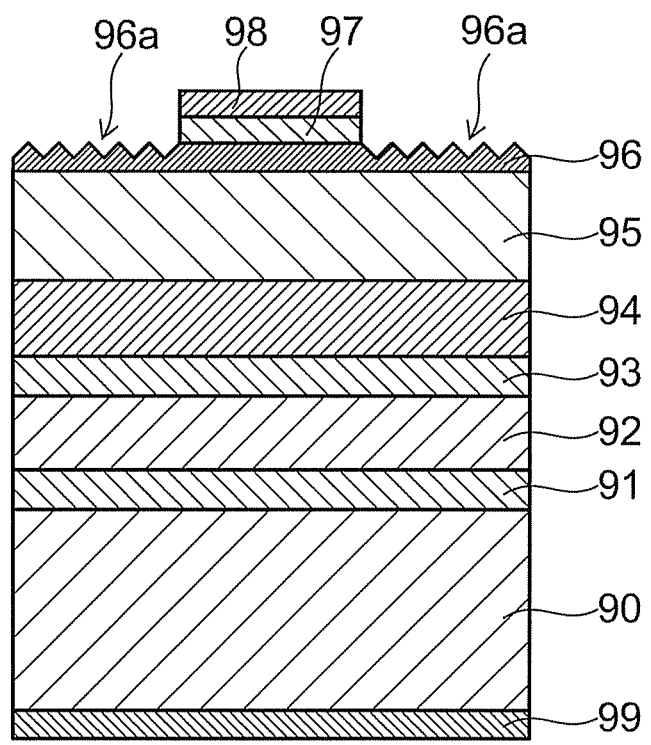
FIG. 9 is a schematic cross-sectional view of a semiconductor light emitting device according to a fifth embodiment.

FIG. 9 is a schematic cross-sectional view of a semiconductor light emitting device according to a fifth embodiment.

The device includes a substrate 90 made of n-type GaP, a buffer layer 91 made of n-type $In_{0.5}Ga_{0.5}P$, a cladding layer 92 made of n-type $In_{0.5}Ga_{0.5}P$, an active layer 93 made of a GaAlAs quantum well, a cladding layer 94 made of p-type $Ga_{0.8}Al_{0.2}As$, a current spreading layer 95 made of p-type $Ga_{0.8}Al_{0.2}As$, a surface processed layer 96 made of p-type $Ga_{0.7}Al_{0.3}As$, a contact layer 97 made of p-type GaAs formed in this order. A p-side electrode 98 on the contact layer 97 and an n-side electrode 99 on a back side of the substrate 90 are formed, respectively.

The Al compositions in the GaAlAs active layer 93 (the barrier layer and the well layer) are adjusted to be the emission wavelength of 850 nm. The buffer layer 91 has a high carrier concentration of $5\times10^{18}$ $cm^{-3}$ to lower the resistance at the interface with GaP sufficiently. The current spreading layer 95 has a concentration of $3\times10^{18}$ $cm^{-3}$, spreading the current injected from the electrode in the device plane due to its sufficiently low resistivity. Furthermore, the bandgap energy of the current spreading layer 95 is larger than that of the active layer with the emission wavelength (1.48 eV) to prevent absorption of the light emitting from the active layer 93. As described in the first embodiment, the emission wavelength of the active layer is not limited to be 850 nm, but it can be set flexibility in the wide range from red to infrared in this structure. And material of the current spreading layer must be selected according to the emission wavelength of the active layer.

Moreover, the valence band edge energy of the surface processed layer 96 from the Fermi level is larger than that of the current spreading layer 95. Furthermore, the bandgap energy of the surface processed layer 06 is larger than that of the active layer 93 to prevent absorption of the light emitting from the active layer 93. Thus, there is no decrease in brightness. Furthermore, since the substrate 90 made of the n-type GaP has a small absorption coefficient for the emission wavelength from the active layer and the light absorption by the substrate becomes low, the light can be effectively extracted outside through the GaP substrate. Improvement of the light extraction efficiency due to the GaP substrate is expected in the wide wavelength range from green~yellow~red to infrared.

At the device upper surface used as a light extraction surface, the mesa concave-convex structures 96a, which are almost similar to that of the first embodiment, are formed outside the p-side electrode 80. As compared with the case of no concave-convex structure, the light extraction efficiency can be improved by a factor of approximately 1.5. If the mesa concave-convex structures are replaced by the nanometer-sized concave-convex structures, the light extraction efficiency is improved by a factor of approximately 2 as compared with the case of no concave-convex structure.

Material for the surface processed layer 96 is selected according to the current spreading layer 95. In this embodiment, the surface processed layer 96 is made of p-type $Ga_{0.7}Al_{0.3}As$ and the current spreading layer 95 is made of p-type $Ga_{0.8}Al_{0.2}As$. The valence band discontinuity between the surface processed layer 96 and GaAs is calculated to be 0.17 eV from FIG. 3B, and the valence band discontinuity between the current spreading layer 95 and GaAs is calculated to be 0.11 eV. Thus, the valence band edge energy of the surface processed layer 96 is 0.06 eV larger than that of the current spreading layer 95.

The range for the desired Al composition x of the surface processed layer 96 can be estimated from FIG. 3B. Since it is preferred that the valence band edge energy in the surface processed layer is 0.02 eV or larger than that in the current spreading layer of $Ga_{0.8}Al_{0.2}As$, GaAlAs with $0.24 \leq x$ can be used as the surface spreading layer. Moreover, by considering the resistivity against oxidation, the Al composition is preferred to be lower than 0.8. That is, the surface treated layer 96 is preferred to be made of $Ga_{0.8}Al_{0.2}As$ with $0.24 \leq x \leq 0.8$.

InGaAlP material can be also used as the surface processed layer 96. Since $In_{0.5}Ga_{0.5}P$ has the smallest valence band discontinuity of $\Delta E=0.30$ eV, InGaAlP materials with any Al composition can be used as the surface processed layer.

In this embodiment, the surface processed layer 96 is made of p-type $Ga_{0.7}Al_{0.3}As$. If the surface processed layer 96 is not formed between the p-side electrode 98 and the current spreading layer 95, n-type or undoped layer can be used as the surface processed layer.

According to the first to fifth embodiment, a surface processed layer is formed on a current spreading layer, and a material having a larger bandgap than the active layer and having a larger conduction band edge energy or a larger valence band edge energy than the current spreading layer is selected for the surface processed layer. This suppresses diffusion of carriers into the concave-convex region formed at the surface of the surface processed layer. Thus, a semiconductor light emitting device with increased light extraction efficiency and improved reliability is realized.

The embodiments of the invention have been described with reference to the drawings. However, the invention is not limited to these embodiments. The material, shape, thickness, and placement of the active layer, the current spreading layer, the surface processed layer, and the concave-convex structures constituting the semiconductor light emitting device can be modified by those skilled in the art without departing from the spirit of the invention, and any such modifications are also encompassed within the scope of the invention.

The invention claimed is:

1. A semiconductor light emitting device comprising:
   an active layer;
   a current spreading layer formed above the active layer, having a larger bandgap energy than the active layer, and spreading injected carriers in the plane of the active layer;
   an intermediate layer formed on the current spreading layer, having a larger bandgap energy than the active layer, and having a lower Al composition than the current spreading layer;
   a surface processed layer formed on the intermediate layer, and having an uneven surface region in which a large number of concave-convex structures are formed at its surface; and
   an electrode formed on a region except the uneven surface region of the surface processed layer, and injecting the carriers to operate,
   wherein the surface processed layer having a higher conduction band edge energy from the Fermi level than that of the intermediate layer, or
   wherein the surface processed layer having a higher valence band edge energy from the Fermi level than that of the intermediate layer.

2. The semiconductor light emitting device according to claim 1, wherein
   the active layer and the surface processed layer are made of $In_y(Al_xGa_{1-x})_{1-y}P$ with $0 \leq x \leq 1$ and $0 \leq y \leq 1$,
   wherein the current spreading layer is made of $Al_zGa_{1-z}As$ with $0 \leq z \leq 1$, and
   wherein the intermediate layer is made of $Al_wGa_{1-w}As$ with $0 \leq w \leq 1$ and $z > w$.

3. The semiconductor light emitting device according to claim 2, wherein the current spreading layer, the intermediate layer, and the surface processed layer have n-type conductivity, respectively, w is 0.5, and a range of x is $0.44 \leq x \leq 1$.

4. A semiconductor light emitting device comprising:
   an active layer;
   an electrode provided above the active layer;
   a current spreading layer provided between the active layer and the electrode, made of p-type $Ga_{1-x1}Al_{x1}As$ with $0 \leq x1 \leq 1$, having a larger bandgap energy than the active layer, and spreading electrons injected from the electrode in the plane of the active layer; and
   a surface processed layer provided above the current spreading layer, made of $Ga_{1-x2}Al_{x2}As$ with $0 \leq x2 \leq 1$, having a larger bandgap energy than the active layer, having a higher valence band edge energy from the Fermi level than the current spreading layer by 0.02 eV or more, and having an uneven surface region with a large number of concave-convex structures, and
   a heterobarrier-lowering layer made of $In_tGa_{1-t}P$ with $0 \leq t \leq 1$ and provided between the surface processed layer and the electrode,
   the electrode not being provided on the uneven surface region.

5. The semiconductor light emitting device according to claim 4, wherein the surface processed layer is selectively provided above the current spreading layer except a region where the electrode is provided.

6. The semiconductor light emitting device according to claim 4, wherein the surface processed layer is further provided in a region between the electrode and the current spreading layer, and the concave-convex structures are not provided in the region between the electrode and the current spreading layer.

7. The semiconductor light emitting device according to claim 4, wherein x1 is 0.2 and a range of x2 is $0.24 \leq x2 \leq 0.8$.

* * * * *